United States Patent
Auracher et al.

(10) Patent No.: US 7,403,551 B2
(45) Date of Patent: Jul. 22, 2008

(54) METHOD AND DEVICE FOR ADJUSTING A LASER

(75) Inventors: Franz Auracher, Baierbrunn (DE); Robert Scholz, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 104 days.

(21) Appl. No.: 10/485,755

(22) PCT Filed: Sep. 5, 2001

(86) PCT No.: PCT/DE01/03468

§ 371 (c)(1),
(2), (4) Date: Jul. 15, 2004

(87) PCT Pub. No.: WO03/017441

PCT Pub. Date: Feb. 27, 2003

(65) Prior Publication Data

US 2004/0246460 A1 Dec. 9, 2004

(30) Foreign Application Priority Data

Aug. 3, 2001 (DE) ................................ 101 38 474

(51) Int. Cl.
*H01S 3/00* (2006.01)
(52) U.S. Cl. .................................. 372/38.07; 372/38.01
(58) Field of Classification Search .............. 372/38.01, 372/38.07
See application file for complete search history.

(56) References Cited

U.S. PATENT DOCUMENTS

| 5,402,433 | A | 3/1995 | Stiscia |
| 5,488,621 | A | 1/1996 | Slawson et al. |
| 5,850,409 | A | 12/1998 | Link |
| 6,292,497 | B1* | 9/2001 | Nakano .................. 372/29.015 |
| 2002/0172240 | A1* | 11/2002 | Kwark .......................... 372/26 |

FOREIGN PATENT DOCUMENTS

EP  0 539 038 A2  4/1993

OTHER PUBLICATIONS

International Search Report, International Application No. PCT/DE01/03468, International Filing Date Sep. 5, 2001, 3 pgs.

* cited by examiner

*Primary Examiner*—Minsun Harvey
*Assistant Examiner*—Marcia A. Golub
(74) *Attorney, Agent, or Firm*—Workman Nydegger

(57) ABSTRACT

The aim of the invention is to adjust the operating point of a laser that can be modulated by a data signal. The operating point of the laser is adjusted by regulating a direct current flowing through the laser; whereby said direct current correlates with the optical characteristics of the laser. In order to carry out said adjustment, the direct current is controlled above an alterable threshold current. A differential current defined from the difference between the direct current and the threshold current or a variable correlating with the differential current is adjusted to a constant value or one that is solely dependent on temperature for the adjustment of said operating point.

6 Claims, 3 Drawing Sheets

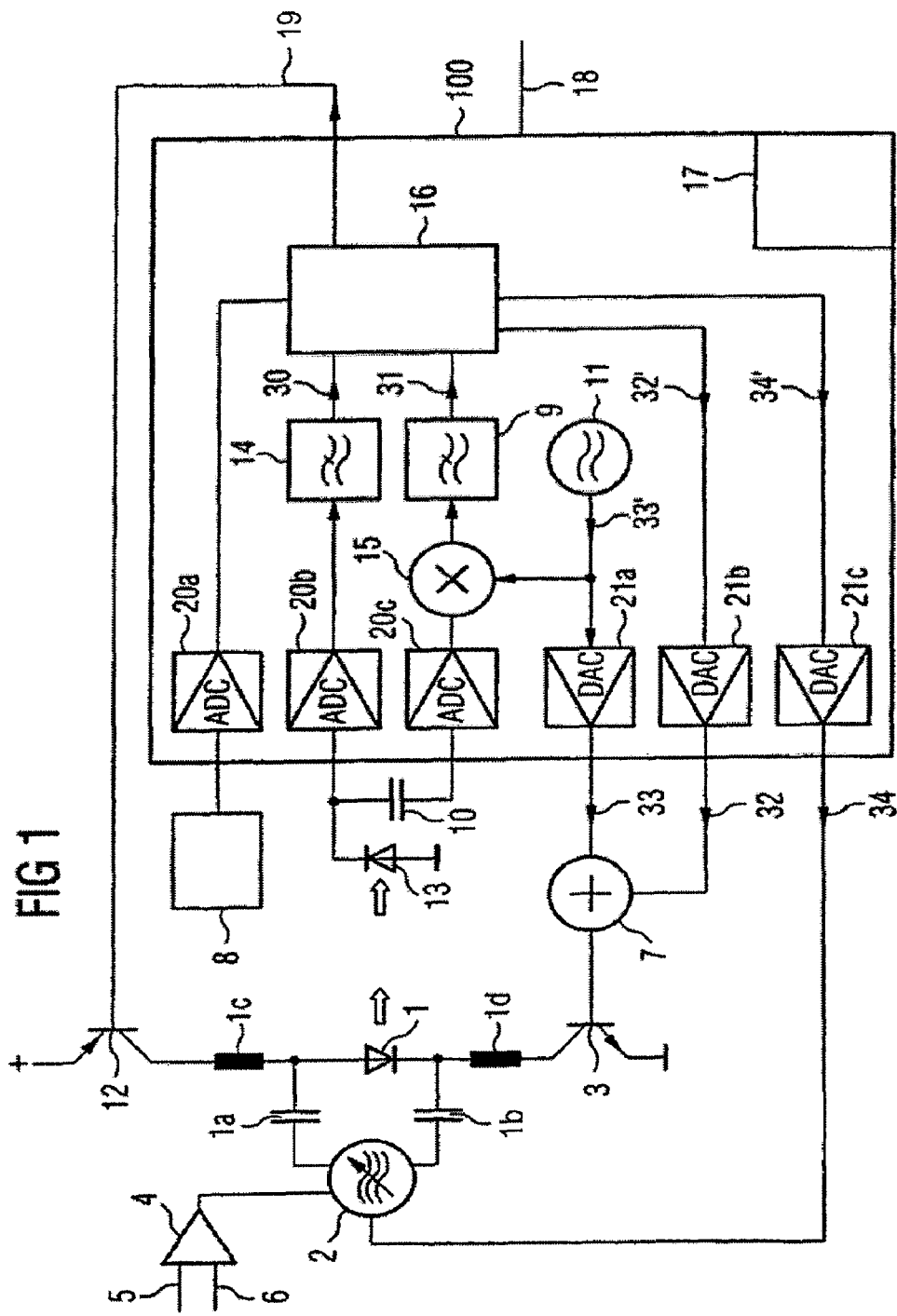

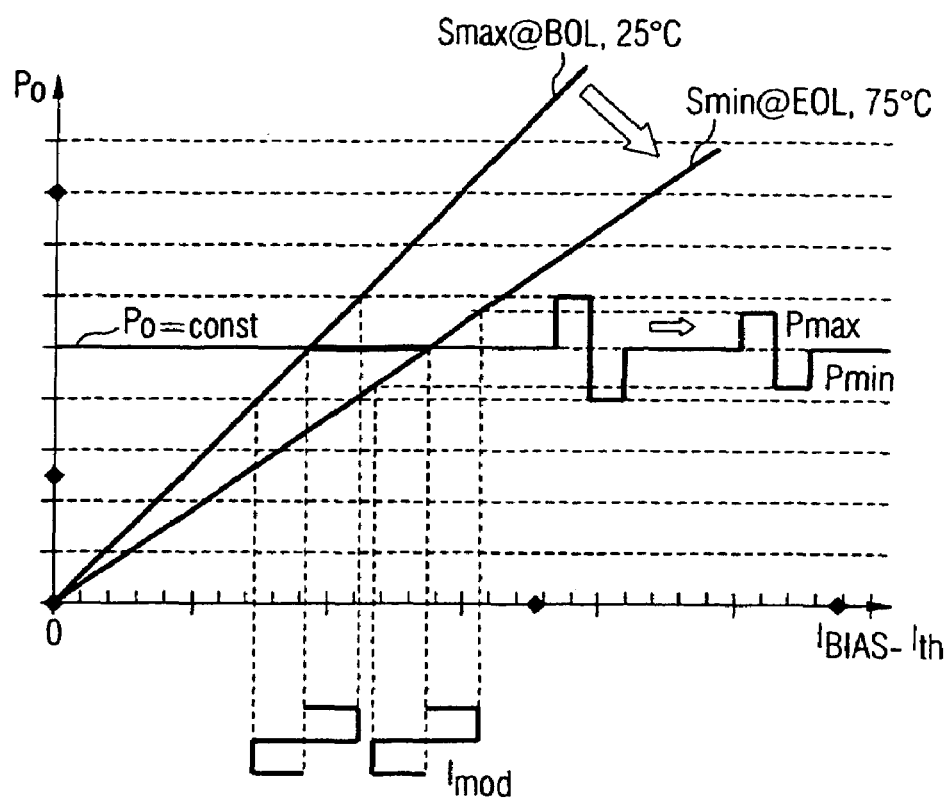

# METHOD AND DEVICE FOR ADJUSTING A LASER

RELATED APPLICATION

This application claims priority to and incorporates by reference International Application No. PCT/DE01/03468 filed Sep. 5, 2001, which is entitled "Method and Device for Adjusting a Laser", which claims priority to German patent application serial no. 101 38 474.2 filed on Aug. 3, 2001, which were not published in English, and which are both hereby incorporated by reference in their entirety.

FIELD OF THE INVENTION

The invention relates to a method and a device for regulating a laser.

BACKGROUND OF THE INVENTION

U.S. Pat. No. 5,850,409 discloses feeding back measurement signals, converted by means of a monitor diode, for regulating the laser power and the output amplitude of the modulated optical data. In this case, a pilot tone is superposed on a data signal, said pilot tone having a relatively low frequency and a low amplitude compared with the data signal. The output amplitude of the modulated data is regulated to a constant value. For this purpose, the amplitude of the pilot tone is set to a constant fraction of the modulation current so that the optical output power is a constant fraction of the amplitude of the optical data with the frequency of the pilot tone. The modulation current is regulated by means of a feedback, so that the optical amplitude of the transmitted data can also be regulated to a desired value.

A second feedback loop is used to regulate the average optical output power of the laser to a fixed value. For this purpose, $I_{BIAS}$ is regulated in such a way that the average optical power $P_0$ is constant independently of the laser slope and thus temperature or aging. Both regulating principles together ensure a constant extinction ratio ER.

However, this regulating principle has the following disadvantages for directly modulated lasers at high data rates:

1. In order that the laser achieves a sufficient modulation bandwidth, $I_{BIAS}-I_{th}$, i.e. the difference between the bias current and the threshold current of the laser, has to be chosen to be relatively high, for example 30 to 50 mA, thereby already resulting in relatively high laser currents. With increasing temperature and aging, the laser slope decreases and the threshold current rises. In the case of regulation to constant power, the reduced laser slope has to be compensated for by a significant increase in the laser current.

This may very rapidly lead to the maximum available or permissible laser current being exceeded. Moreover, a very large modulation amplitude $I_{mod}$ is then necessary for a constant extinction ratio, which in turn is difficult to achieve at high data rates and furthermore leads to undesirable relaxation oscillations at the high level "1".

These relationships are illustrated in FIG. 3, in which the power $P_0$ of a laser diode is plotted as a function of the difference $I_{BIAS}-I_{th}$. Smax specifies the maximum slope of the laser diode at the beginning of life (BOL) and at low temperature (25° C.), and 5 min specifies the minimum slope of the laser diode at the end of life (EOL) and at high temperature (75° C.). The modulation current of a data signal is specified by Imod.

On the one hand, it can be seen directly from FIG. 3 that, in the case of a control to $P_0$=constant, a decreasing laser slope leads to a lower extinction ratio ET=Pmax/Pmin. Although this can be compensated for by increasing the modulation current Imod, an aging-dictated change in the extinction ratio ER is generally unavoidable. The consequence of this, however, is that a very high value of ER must initially be present at the beginning of life (BOL) in order to be able to still guarantee the required ER at the end of life (EOL). However, a high extinction ratio disadvantageously leads to a high degree of relaxation oscillations of the laser.

On the other hand, FIG. 3 reveals that as the laser slope decreases, for a regulation to constant power $P_0$ it is necessary for the laser current to be considerably increased.

2. The regulation to constant power is relatively inaccurate since the ratio of detector current of the monitor diode to the power in the fiber changes with respect to temperature and to aging. This applies especially to the DFB laser modules that are usually used for high data rates and the customary construction in which the monitor diode measures the radiation emerging from the rear facet. This has the effect that the slope has to be complied with extremely accurately during the production of the laser modules, in particular the fiber coupling.

Moreover, very narrow tolerances have to be complied with for a laser and a regulator in order to enable the operation of a laser within predetermined specification limits such as maximum and minimum optical power, maximum BIAS current, temperature range, extinction ratio and frequency response.

SUMMARY OF THE INVENTION

Therefore, the invention is based on the object of specifying a new regulation method which reduces the tendency of a laser to effect relaxation oscillations without increasing outlay for cooling the laser, and thereby enables in particular the direct modulation of a semiconductor laser in the uncooled state even at high data rates in the region of 10 Gbit/s.

Accordingly, the operating point of a laser that can be modulated by a data signal is regulated. The regulation method is preferably employed for semiconductor laser diodes. A preferred application is in low-cost solutions for single-channel data transmissions over short distances of 10 to 20 km, for example.

The operating point of the laser is regulated by the control of a direct current which flows through the laser, the direct current correlating with optical properties of the laser. An optical property is, by way of example, the limiting frequency of the modulation, the optical output power or the slope of the laser diode.

For the regulation, the direct current is controlled above a variable threshold current, so that the possible operating points of the laser can be chosen for a direct current greater than the threshold current. In order to regulate the operating point, a differential current defined from the difference between the direct current and the threshold current or a variable correlating with the differential current is regulated to a constant value, although the constant value may be temperature-dependent. The direct current may accordingly vary for a defined operating point.

The solution according to the invention of regulating $I_{BIAS}-I_{th}$ to a constant value or one which is only dependent on temperature has the following advantages:

1. A relatively high value of $I_{BIAS}-I_{th}$ can be chosen for all operating conditions, a large modulation bandwidth thereby being provided.

2. The modulation bandwidth can be kept largely independent of temperature through a temperature-dependent control of $I_{BIAS}$-$I_{th}$. The modulation bandwidth (also referred to as transmission bandwidth) decreases with increasing temperature and increases with $I_{BIAS}$-$I_{th}$. The fall in the modulation bandwidth as the temperature increases can thus be compensated for by increasing the difference $I_{BIAS}$-$I_{th}$.

3. Since the regulation is very accurate, a larger tolerance of the slope achieved in the fiber (equal to optical line in the fiber/($I_{BIAS}$-$I_{th}$)) may be permitted in the case of the fiber coupling.

The solution according to the invention thus provides for regulating the difference between bias current and threshold current of the laser to a constant or temperature-dependent value. Only in the simplest case is the value of $I_{BIAS}$-$I_{th}$ regulated here to a fixed, temperature-independent value. A temperature-dependent regulation, i.e. a regulation of $I_{BIAS}$-$I_{th}$ to a value dependent on temperature, is preferred in order that the modulation bandwidth of the laser, which decreases as the temperature increases, is compensated for by an increase in the value $I_{BIAS}$-$I_{th}$. In order that the extinction ratio nevertheless remains the same, it is necessary also to control the amplitude of the modulation current in temperature-dependent fashion. Thus, the extinction ratio is dependent on $I_{BIAS}$-$I_{th}$ and is likewise constant given a constant value of $I_{BIAS}$-$I_{th}$ and a constant amplitude of the modulation current. In order to ensure a constant extinction ratio even in the case of a temperature-dependent regulation of the value $I_{BIAS}$-$I_{th}$, the amplitude of the modulation current is changed in accordance with the value of $I_{BIAS}$-$I_{th}$.

In one preferred refinement of the invention, in addition to the direct current, a pilot signal having an AC component is applied to the laser diode. In the simplest case, the pilot signal is an alternating current having, compared with the modulation frequency, a frequency that is orders of magnitude lower and a smaller amplitude. However, it is also possible to use all other pilot signals suitable for determining the optical property of the laser, such as a burst or pulsed signals. The two currents with DC component and AC component are, in particular, fed through the same electrodes of the laser diode, or are alternatively conducted through the laser diode in different directions by means of a plurality of electrodes. The light of the laser diode which is generated by the direct current, the pilot signal and the data signal is detected and evaluated and the direct current is controlled in a manner dependent on this evaluation.

A development of this refinement comprises receiving means, in particular a monitor diode, and evaluation means, which determine a DC measurement signal correlating with the direct current and an AC measurement signal correlating with the pilot signal for the evaluation. Preferably, the measurement signals are proportional to the direct current and, respectively, the amplitude of the pilot signal.

In one preferred refinement of the invention, the ratio of the DC measurement signal (corresponding to the average optical power of the monitor diode) to the amplitude of the AC measurement signal (corresponding to the optical power of the pilot signal) is formed for the regulation. In this case, the amplitude of the AC measurement signal is a measure of the laser slope. The DC measurement signal is proportional to the average optical power of the laser. The value of $I_{BIAS}$-$I_{th}$ can be determined by forming the ratio of the two powers or of the corresponding currents of the monitor diode.

Consequently, the quotient of DC signal and AC signal of the monitor diode is formed in the case of the regulating concept according to the invention. This has the advantage that a change in the monitor diode slope is not significant. In particular, on account of the ratio formation, the measurement signals are independent of a measuring apparatus drift.

The amplitude of the AC measurement signal ($I_{MDac}$) is preferably formed by multiplication of the AC measurement signal ($I_{MDac}$) by the pilot signal ($I_{LDAC}$) and subsequent integration (synchronous or lock-in detection). The amplitude of the pilot signal is available as controlled variable through the control of the pilot current. The ratio of the DC measurement signal to the amplitude of the AC measurement signal is compared with the constant value or a variable derived therefrom, which characterizes the operating point, for the evaluation. The derived variable is associated with the constant value for example by means of an algorithm, and in the simplest case is proportional to the constant value.

In a manner dependent on this comparison, the direct current is regulated or controlled in such a way that the result and the constant value or the derived variable essentially correspond, and the differential current is thus regulated to the constant or temperature-dependent value. The operating point that is essentially defined by this correspondence is thereby kept within small deviations.

This method enables the differential current to be regulated without having to explicitly measure the threshold current.

BRIEF DESCRIPTION OF THE DRAWINGS

The invention is explained in more detail below using an exemplary embodiment with reference to drawings, in which:

FIG. 1 shows a schematic circuit diagram of a regulating device,

FIG. 3 shows the power $P_0$ of a laser diode as a function of the difference $I_{BIAS}$-$I_{th}$ in the case of regulation to constant power of a laser diode as known in the prior art.

DETAILED DESCRIPTION OF THE INVENTION

Figure 2A:
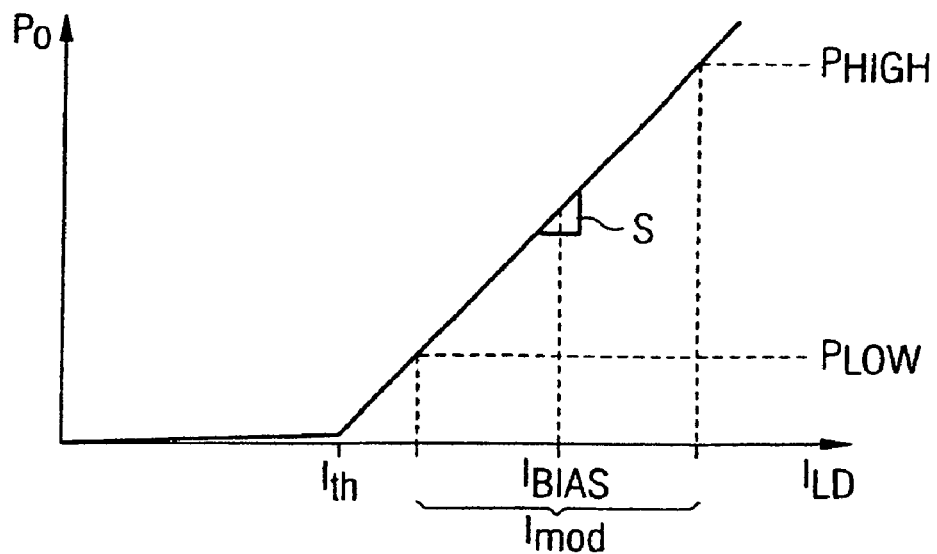
FIG. 2a shows a characteristic curve of a laser diode.

In accordance with FIG. 1, a laser diode 1 is coupled to a monitor diode 13 via an optical connection. An optical signal emitted by the laser diode 1 is transmitted partly to the monitor diode 13 via the optical coupling and converted into an electrical monitor signal, for example a monitor current. Furthermore, the laser diode is thermally coupled to a temperature sensor 8, which converts the present temperature of the laser diode into an electronic signal.

The monitor diode 13 and the temperature sensor 8 are connected to a microcontroller 100, which evaluates the electrical signals. The microcontroller 100 additionally has analog and digital control outputs operatively connected to peripheral elements of the laser diode 1. The microcontroller 100 controls a PNP switching transistor 12 via the control line 19, so that the laser current of the laser diode 1 can be switched off by means of this safety circuit in the case of overheating.

The laser current that can be switched by the switching transistor 12 flows through inductances 1c and 1d, through the laser diode 1 and through a current sink 3 formed by an NPN bipolar transistor 3. The inductances 1c, 1d prevent an attenuation of high-frequency modulation signals by parasitic capacitances of the transistors 3 and 12. Furthermore, the laser diode 1, for the modulation of high-frequency data, is capacitively connected to the modulator 2 via two capacitors 1a and 1b. The data input of the modulator 2 is fed with data by the input stage 4, which has an inverting input 5 and a noninverting input 6.

In order to set the amplitude of the modulation, the modulator 2 is connected to the microcontroller 100 via a control line with the control signal 34. A control input of the current sink 3 is connected to an adder 7. As an alternative to the illustration of FIG. 1, the adder 7 may also be an integral constituent part of the microcontroller 100.

The microcontroller 100 has a plurality of analog inputs which convert the analog signals, with the aid of analog-to-digital converters 20a, 20b, 20c, into digital signals which are in turn evaluated by a digital computing unit of the microcontroller 100 with the processing of a corresponding program. Digital control signals are in turn generated on the basis of the evaluation results, which control signals, as analog output variables by means of digital-to-analog converters 21a, 21b, 21c, control the control inputs of the peripheral elements 2, 3, 12 of the laser diode 1. As an alternative to the circuit illustrated schematically in FIG. 1, the functions of the microcontroller 100 may also be realized by a purely analog circuit.

Some regulation elements of the microcontroller 100 are illustrated separately within the microcontroller 100 in FIG. 1, although these can be generated simply in a computing unit by means of a program sequence. Thus, the microcontroller 100 has a regulator, e.g. a proportional-integral regulator 16 (PI regulator), which introduces a BIAS signal 32' into the digital-to-analog converter 21b. This BIAS signal passes as an analog BIAS signal 32 via a control line to the adder 7. In addition, a low-frequency pilot signal 33' having a frequency of 500 Hz, for example, and a small amplitude compared with the modulation signal is generated in an oscillator 11 in the microcontroller 100. Said pilot signal 33' is converted into an analog pilot signal 33 by means of the digital-to-analog converter 21a and likewise fed to the adder 7.

The signals added by the adder 7 are transmitted to the control input of the current sink 3 and generate a BIAS direct current ($I_{BIAS}$) correlating with the BIAS signal and an alternating current ($I_{LDac}$) correlating with the pilot signal 33 through the laser diode 1. These currents are transmitted from the laser diode 1 to the monitor diode 13 via the optical coupling. The capacitor 10 connected to the monitor diode 13 filters out the DC component ($I_{MDdc}$) of the monitor signal.

The remaining AC signal component ($I_{MDac}$) is converted into a digital AC signal ($I_{MDac}$) by means of the analog-to-digital converter 20c. The modulation signal is advantageously filtered out beforehand, but this is not illustrated in FIG. 1. The digital AC signal ($I_{MDac}$) is mixed with the pilot signal 33' in the mixer 15. In the frequency mixer 15, the two signals for mixing are multiplied together, for example, so that frequency components which deviate from the pilot frequency and also DC components do not affect one another (synchronous rectifier). The output signals of the frequency mixer 15 are fed to a first low-pass filter 9 or integrator 9. In this case, the cut-off frequency of the low-pass filter 9 or integrator 9 is significantly lower than the pilot frequency, so that an essentially smoothed signal 31 correlating with the amplitude of the AC signal ($I_{MDac}$) is made available to the PI regulator.

By contrast, the analog-to-digital converter 20b also converts the DC component ($I_{MDdc}$) of the monitor signal. The cut-off frequency of the low-pass filter 14 or integrator 14 is once again significantly lower than the pilot frequency of the pilot signal 33, so that the components of the pilot signal are filtered out. Accordingly, an essentially smoothed signal 30 correlating with the value of the DC signal ($I_{MDdc}$) is made available to the PI regulator. Furthermore, the PI regulator 16 is connected to the temperature sensor 8 via the analog-to-digital converter 20a.

In order to influence the regulation or switching of the laser currents from further functional units, the microcontroller 100 is connected to an external data connection 18, for example to a BUS system 18. In addition, the microcontroller 100 has a nonvolatile memory 17 in order to store the regulating parameters and start parameters for the regulation or in order to add new laser specifications.

The characteristic curve of the laser diode 1 is illustrated in FIG. 2a. In this case, the optical power $P_O$ is plotted against the laser diode current $I_{LD}$. Only above a threshold current $I_{th}$ does the laser diode 1 begin significantly to emit optical power. The laser diode 1 is operated at an operating point for the laser diode current value $I_{BIAS}$. Around this operating point, the laser diode 1 is modulated, with the states $P_{HIGH}$ and $P_{LOW}$, in accordance with the associated modulation current $I_{mod}$.

Figure 2B:
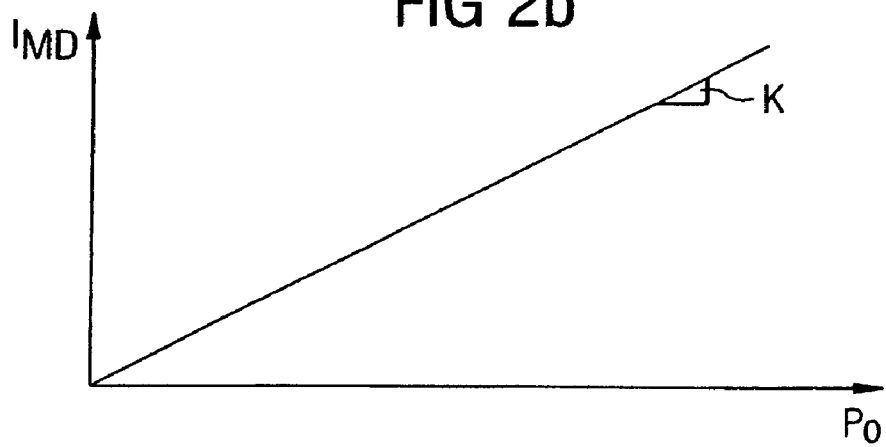
FIG. 2b shows a transfer characteristic curve between a laser diode and a monitor diode.

In FIG. 2b, the transfer function of the monitor diode 13 with the monitor current $I_{MD}$ is plotted against the optical power $P_o$. K is the coupling factor between the optical power $P_o$ and the monitor current $I_{MD}$.

Figure 2C:
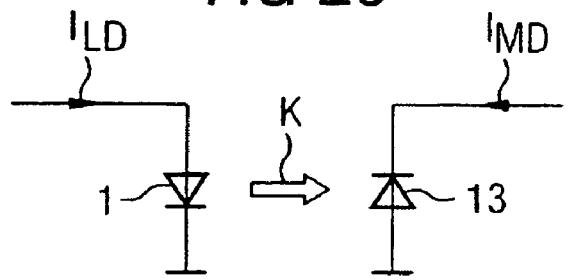
FIG. 2c shows a detail from the schematic circuit diagram from FIG. 1

FIG. 2c shows a detail from the schematic circuit diagram of FIG. 1. The laser diode is fed by means of the laser diode current $I_{LD}$. By means of the optical coupling K, a part of the radiated optical energy is transmitted to the monitor diode 13, which draws a monitor current $I_{MD}$ correlating with the optical power.

A simple mathematical derivation of the regulation principles is explained below.

The slope S of the laser diode 1 is given in accordance with FIG. 2a for a laser current $I_{LD}$ greater than threshold current $I_{th}$ by:

$$S = \frac{\Delta P_o}{\Delta I_{LD}} \text{ for } I_{LD} \geq I_{th} \qquad [1]$$

For a given operating point, the following holds true, by way of example:

$$S = \frac{P(I_{LD}) - P(I_{th})}{I_{LD} - I_{th}} \qquad [2]$$

In this case, neither the slope S nor the threshold current $I_{th}$ are constant over the lifetime of the laser. Moreover, both values are temperature-dependent. Assuming that the optical power $P_o$ is negligible for currents less than or equal to the threshold current, the following consequently holds true:

$$P(I_{th}) = 0 \text{ so that } S = \frac{P(I_{LD})}{I_{LD} - I_{th}} \qquad [3]$$

or the following holds true after corresponding transformation for the corresponding operating point:

$$I_{LD} - I_{th} = \frac{P_o}{S} \qquad [4]$$

In order to operate the laser at the optimum operating point, the differential current $I_{diff}=I_{LD}-I_{th}$ should be regulated to a constant or temperature-dependent value. This presents difficulties insofar as the threshold current can be determined only with difficulty during operation. By way of example, for this purpose the threshold current $I_{th}$ could be measured in pauses between the data to be transmitted, but the optical behavior is not adequate when the threshold current $I_{th}$ is exceeded again. Therefore, a different, particularly advantageous method for regulation is set forth below.

By way of the coupling factor K, variables of the laser diode 1 are converted into corresponding measurement signals of the monitor diode 13.

$$P_o = \frac{I_{MDdc}}{K} \qquad [5]$$

If the AC current signal of the pilot signal is considered, then the following analogously holds true in conjunction with equation 1:

$$S = \frac{I_{MDac}}{K \cdot I_{LDac}} \qquad [6]$$

In this case, $I_{MDac}$ is the amplitude of the AC measurement signal of the monitor diode. $I_{Ldac}$ is the amplitude of the pilot signal.

If the two equations 5 and 6 are inserted into equation 4, then it follows that:

$$\frac{P_o}{S} = \frac{\frac{1}{K} \cdot I_{MDdc}}{\frac{1}{K} \cdot I_{MDac} \cdot \frac{1}{I_{LDac}}} \qquad [7]$$

For the operating point $$I_{BIAS}=I_{LD}|_{AP} \qquad [8]$$

is fixed. This means that, for example contrary to the regulation principle known from U.S. Pat. No. 5,850,409, the amplitude of the pilot tone is set to a fixed value. Consequently, the following holds true as initial equation for the regulation:

$$I_{BIAS} - I_{th} = \frac{I_{MDdc}}{I_{MDac}} \cdot I_{LDac} \qquad [9]$$

The differential current $I_{diff}$ is thus equal to the left-hand or right-hand part of equation 9. For the regulation, the ratio of the DC measurement signal $I_{MDdc}$ to the amplitude of the AC measurement signal $I_{MDac}$ is accordingly multiplied by the amplitude of the pilot signal $I_{LDac}$. The result of the multiplication is compared with the constant value $I_{diff}$ or a variable derived therefrom, which characterizes the operating point in a similar manner, for the evaluation. In a manner dependent on this comparison, the direct current is regulated or controlled in such a way that the result of the right-hand term of the equation and the constant value of $I_{diff}$ essentially correspond and small deviations are correspondingly corrected by tracking the bias current $I_{BIAS}$.

The value for the differential current $I_{diff}$ is advantageously defined in such a way that this value corresponds to an operating point of the laser 1 in the region of a predetermined minimum transmission bandwidth B for modulation signals. The intention is thus advantageously to ensure that, irrespective of the age of the laser 1, a minimum transmission bandwidth B is available and the transmitted signals are not distorted or greatly attenuated by an inadequate transmission bandwidth. In many cases this is more important than an optical output power that is as constant as possible.

Since in particular the transmission bandwidth and other characteristic variables of the laser are temperature-dependent, the predetermined regulation value of the differential current $I_{diff}$, depending on the respective present temperature of the laser 1, is determined for example from empirically determined and stored values. As an alternative, it is also possible to calculate an algorithm for optimally calculating the differential current $I_{diff}$ depending on the temperature and, if appropriate, further influencing variables. A temperature-dependent control of the difference of $I_{BIAS}-I_{th}$ is thus effected. As a result, a sufficient transmission bandwidth of the laser is achieved even in the case of varying temperatures. By means of preferred simultaneous control of the modulation current in accordance with the value of $I_{BIAS}-I_{th}$, a constant extinction ratio is simultaneously ensured.

As an alternative or in addition to the adaptation of the predetermined value of the differential current $I_{diff}$, in one advantageous refinement of the invention, the value for the amplitude of the pilot signal $I_{LDac}$ is predetermined.

Although the mean optical output power varies depending on the bias current $I_{BIAS}$, the extinction ratio can be regulated such that it is constant to the greatest possible extent. The following holds true for the extinction ratio ER:

$$ER = \frac{P_{HIGH}}{P_{LOW}} = \frac{S(I_{BIAS} - I_{th}) + \frac{I_{mod}}{2}}{S(I_{BIAS} - I_{th}) - \frac{I_{mod}}{2}} = \frac{(I_{BIAS} - I_{th}) + \frac{I_{mod}}{2}}{(I_{BIAS} - I_{th}) - \frac{I_{mod}}{2}} \qquad [10]$$

S cancels out in this case.

It follows from (10) that, if the values $I_{BIAS}-I_{th}$ and Imod are constant, then the extinction ratio ER is also constant. Imod is the amplitude of the modulation signal in this case.

However, if the value $I_{BIAS}-I_{th}$ is advantageously raised with increasing temperature in order to compensate for the fall in the laser bandwidth with increasing temperature, then the amplitude of the modulation current Imod is expediently raised in the same proportion as $I_{BIAS}-I_{th}$, in order that the extinction ratio ER remains constant. For this purpose, a temperature-dependent control signal 34 for setting the amplitude of the modulation or the modulation swing is transmitted to the modulator 2 (cf. FIG. 1).

The regulation of the differential current $I_{diff}$ or of a variable corresponding to the latter and the regulation of the extinction ratio ER should not have the effect that the laser 1 is operated outside its specification limits. For this purpose, monitoring is additionally effected to ensure that the mean optical power is kept within a power window above a lower threshold value for a minimum required power for the operation of the laser and below an upper threshold value. The upper threshold value has the effect that the direct current $I_{BIAS}$ is limited depending on an optical power Po of the laser 1 in such a way that the optical power Po does not exceed a maximum value. This is important in particular for safety aspects, so that the risk of injury to eyes is reduced by virtue of the power being limited.

The invention claimed is:
1. A device for regulating a laser diode that emits a light which correlates with the sum of a direct current ($I_{BIAS}$) and a pilot signal ($I_{LDAC}$), the direct current ($I_{BIAS}$) correlating with optical properties of the laser diode, the laser diode having a threshold current ($I_{th}$), the device comprising:
   a driver for regulating the direct current ($I_{BIAS}$),
   a monitor device that converts the light into a monitor current ($I_{MD}$) having a DC measurement signal ($I_{MDdc}$) correlating with the direct current ($I_{BIAS}$) and an AC signal ($I_{MDac}$) correlating with the pilot signal ($I_{LDAC}$),
   means for calculating a differential current ($I_{diff}$) defined by a difference between the direct current ($I_{BIAS}$) and the threshold current ($I_{th}$) or a variable correlating with the differential current ($I_{diff}$), and
   means for regulating the differential current ($I_{diff}$) or the variable correlating with the differential current ($I_{diff}$) to a constant value or a value which is only dependent on temperature, the means for regulating comprising:
      integration means which integrates a mixed signal comprising the AC signal and the pilot signal ($I_{LDAC}$) to form an AC measurement signal ($I_{MDac}$) correlating with the amplitude of the AC signal ($I_{MDac}$); and
      a regulator which multiplies the ratio of the DC measurement signal ($I_{MDdc}$) to the amplitude of the AC measurement signal ($I_{MDac}$) by the amplitude of the pilot signal ($I_{LDAC}$) to obtain a result and compares the result with a constant value of the differential current ($I_{diff}$) or a variable derived therefrom which characterizes the operating point, for the evaluation and which, in a manner dependent on this comparison, regulates or controls the direct current ($I_{BIAS}$) in such a way that the result and the constant value or the derived variable essentially correspond.

2. The device as claimed in claim 1, wherein the monitor device comprises a monitor diode that proportionally detects the light generated by the laser diode and a capacitance connected to the monitor diode.

3. The device as claimed in claim 2, wherein the means for calculating a differential current ($I_{diff}$) comprises a microcontroller having analog-to-digital converters for analog inputs and digital-to-analog converters for analog outputs, one or a plurality of whose analog outputs, for controlling the direct current ($I_{BIAS}$) and the pilot signal ($I_{LDAC}$) are connected to the driver or to an adder connected to the driver, and whose analog inputs are connected to the monitor diode, the capacitance and a temperature sensor.

4. A device for regulating a laser diode that emits a light which correlates with the sum of a direct current ($I_{BIAS}$) and a pilot signal ($I_{LDAC}$), the direct current ($I_{BIAS}$) correlating with optical properties of the laser diode, the laser diode having a threshold current ($I_{th}$), the device comprising:
   a driver for regulating the direct current ($I_{BIAS}$);
   a monitor diode that proportionally detects the light generated by the laser diode, wherein the AC current component of the monitor diode current can be separated from the DC current component by a capacitance connected to the monitor diode and wherein the monitor diode converts the light into a monitor current ($I_{MD}$) having a DC measurement signal ($I_{MDdc}$) correlating with the direct current ($I_{BIAS}$) and an AC signal ($I_{MDac}$) correlating with the pilot signal ($I_{LDac}$),
   means for calculating a differential current ($I_{diff}$) defined by a difference between the direct current ($I_{BIAS}$) and a the threshold current ($I_{th}$) or a variable correlating with the differential current ($I_{diff}$), the means for calculating comprising a microcontroller having analog-to-digital converters for analog inputs and digital-to-analog converters for analog outputs, one or a plurality of whose analog outputs, for controlling the direct current ($I_{BIAS}$) and the pilot signal ($I_{LDAC}$) are connected to the driver or to an adder connected to the driver, and whose analog inputs are connected to the monitor diode, the capacitance and a temperature sensor, and
   means for regulating the differential current ($I_{diff}$) or the variable correlating with the differential current ($I_{diff}$) to a constant value or one a value which is only dependent on temperature, wherein the means for regulating the differential current ($I_{diff}$) comprises:
      a separating device, which separates the AC signal from the DC measurement signal ($I_{MDdc}$),
      conversion means which subjects the AC signal to analog-to-digital conversion;
      integration means which integrates a mixed signal comprising the converted AC signal and the pilot signal ($I_{LDAC}$) to form an AC measurement signal ($I_{MDac}$) correlating with the amplitude of the AC signal;
      filter means which filters the AC signal from the monitor current so that the DC measurement signal ($I_{MDdc}$) is evaluated, and
      a regulator which multiplies the ratio of the DC measurement signal ($I_{MDdc}$) to the amplitude of the AC measurement signal ($I_{MDac}$) by the amplitude of the pilot signal ($I_{LDAC}$) to obtain a result and compares the result with the constant value of the differential current ($I_{diff}$) or a variable derived therefrom which characterizes the operating point, for the evaluation and which, in a manner dependent on this comparison, regulates or controls the direct current ($I_{BIAS}$) in such a way that the result and the constant value or the derived variable essentially correspond.

5. The device as claimed in claim 1, wherein the means for calculating a differential current ($I_{diff}$) comprises a microcontroller having analog-to-digital converters for analog inputs and digital-to-analog converters for analog outputs, and wherein one or more of the analog outputs, is connected to the driver or to an adder connected to the driver, and wherein the monitor device and a temperature sensor are each connected to a separate one of the analog inputs.

6. The device as claimed in claim 1, wherein the means for regulating further comprises:
   a separating device, which separates the AC signal ($I_{MDac}$) from the DC measurement signal ($I_{MDdc}$);
   conversion means which subjects the AC signal ($I_{MDac}$) to analog-to-digital conversion; and
   filter means which filters the AC signal ($I_{MDac}$) from the monitor current ($I_{MD}$)

* * * * *

UNITED STATES PATENT AND TRADEMARK OFFICE
CERTIFICATE OF CORRECTION

PATENT NO. : 7,403,551 B2  Page 1 of 3
APPLICATION NO. : 10/485755
DATED : July 22, 2008
INVENTOR(S) : Auracher et al.

It is certified that error appears in the above-identified patent and that said Letters Patent is hereby corrected as shown below:

Title page should be deleted and substitute therefor the attached title page.

Drawings
Sheet 1, replace FIG. 1 with the figure depicted below, wherein label 34', which is never mentioned, is removed

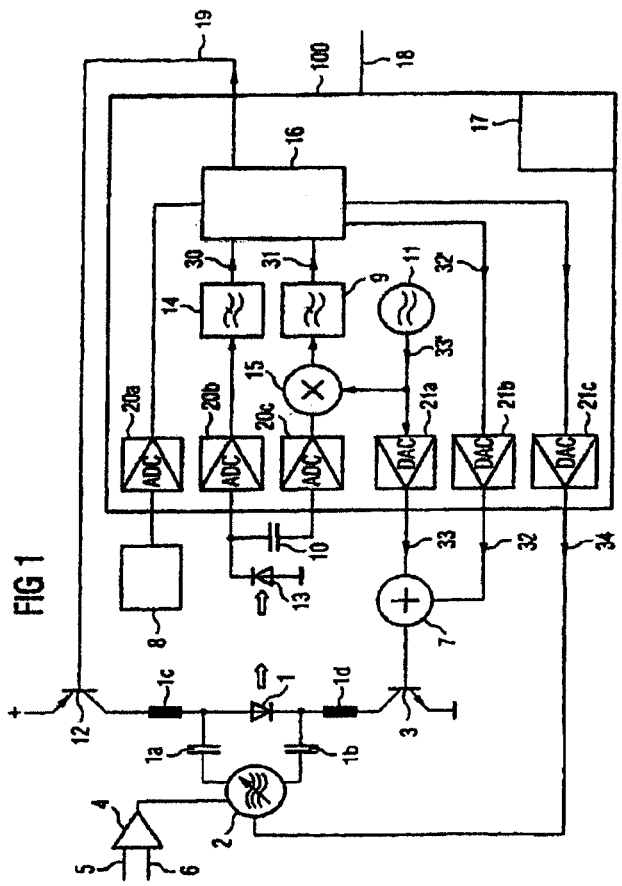

Signed and Sealed this

Sixth Day of July, 2010

David J. Kappos
Director of the United States Patent and Trademark Office

Sheet 3, replace FIG. 3 with the figure depicted below, wherein FIG. 3 is labeled as Prior Art

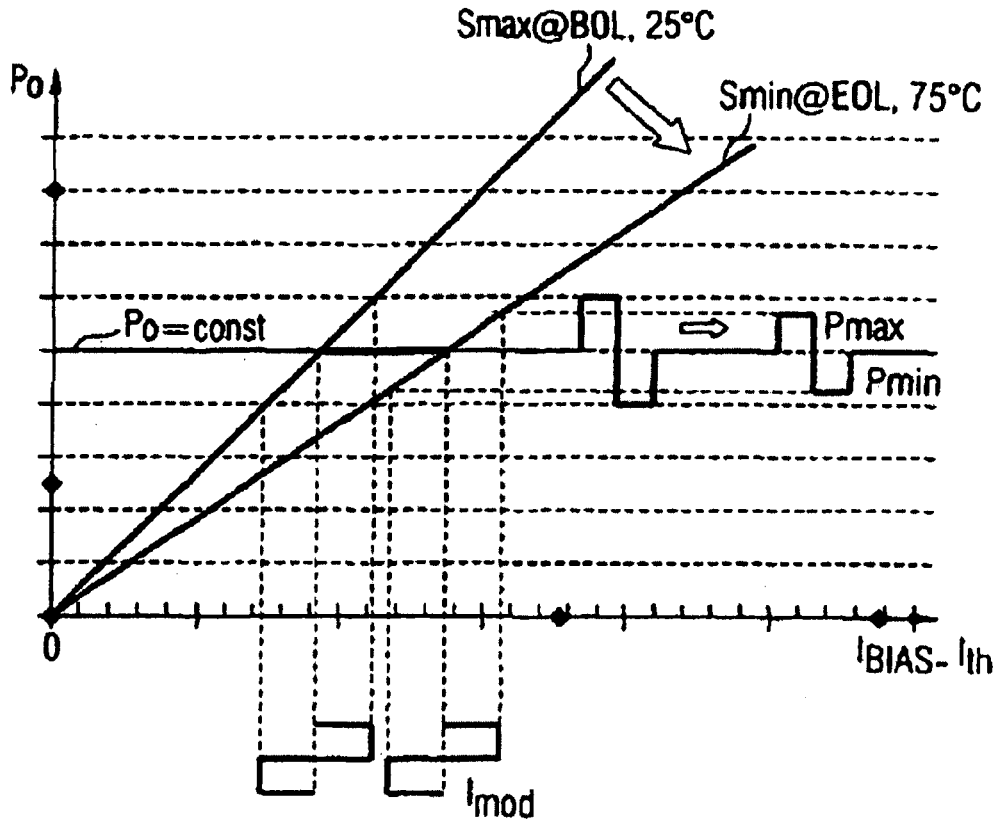

Column 4
Line 48, change "laser diode" to --laser diode 1--
Line 50, change "laser diode" to --laser diode 1--
Line 63, change "NPN bipolar transistor 3." to --NPN bipolar transistor--

Column 5
Line 38, change "the BIAS signal" to --the BIAS signal 32--
Line 60, change "regulator." to --regulator 16.--
Line 65, change "the pilot signal" to --the pilot signal 33--

Column 6
Line 1, change "the PI regulator" to --the PI regulator 16--
Line 25, change "laser diode" to --laser diode 1--

Column 10
Line 5, change "current ($I_{BIAS}$) and a the" to --current ($I_{BIAS}$) and the--

CERTIFICATE OF CORRECTION (continued)

(12) United States Patent
Auracher et al.

(10) Patent No.: US 7,403,551 B2
(45) Date of Patent: Jul. 22, 2008

(54) METHOD AND DEVICE FOR ADJUSTING A LASER

(75) Inventors: Franz Auracher, Baierbrunn (DE); Robert Scholz, Berlin (DE)

(73) Assignee: Finisar Corporation, Sunnyvale, CA (US)

( * ) Notice: Subject to any disclaimer, the term of this patent is extended or adjusted under 35 U.S.C. 154(b) by 104 days.

(21) Appl. No.: 10/485,755

(22) PCT Filed: Sep. 5, 2001

(86) PCT No.: PCT/DE01/03468

§ 371 (c)(1),
(2), (4) Date: Jul. 15, 2004

(87) PCT Pub. No.: WO03/017441

PCT Pub. Date: Feb. 27, 2003

(65) Prior Publication Data
US 2004/0246460 A1 Dec. 9, 2004

(30) Foreign Application Priority Data
Aug. 3, 2001 (DE) .................... 101 38 474

(51) Int. Cl.
*H01S 3/00* (2006.01)
(52) U.S. Cl. .................... 372/38.07; 372/38.01
(58) Field of Classification Search ............. 372/38.01, 372/38.07
See application file for complete search history.

(56) References Cited

U.S. PATENT DOCUMENTS

| | | |
|---|---|---|
| 5,402,433 A | 3/1995 | Stiscia |
| 5,488,621 A | 1/1996 | Slawson et al. |
| 5,850,409 A | 12/1998 | Link |
| 6,292,497 B1 * | 9/2001 | Nakano ............ 372/29.015 |
| 2002/0172240 A1 * | 11/2002 | Kwark ................. 372/26 |

FOREIGN PATENT DOCUMENTS

EP   0 539 038 A2   4/1993

OTHER PUBLICATIONS

International Search Report, International Application No. PCT/DE01/03468, International Filing Date Sep. 5, 2001, 3 pgs.

* cited by examiner

*Primary Examiner*—Minsun Harvey
*Assistant Examiner*—Marcia A. Golub
(74) *Attorney, Agent, or Firm*—Workman Nydegger

(57) ABSTRACT

The aim of the invention is to adjust the operating point of a laser that can be modulated by a data signal. The operating point of the laser is adjusted by regulating a direct current flowing through the laser; whereby said direct current correlates with the optical characteristics of the laser. In order to carry out said adjustment, the direct current is controlled above an alterable threshold current. A differential current defined from the difference between the direct current and the threshold current or a variable correlating with the differential current is adjusted to a constant value or one that is solely dependent on temperature for the adjustment of said operating point.

6 Claims, 3 Drawing Sheets